(12) United States Patent
Wallace

(10) Patent No.: US 7,623,357 B2
(45) Date of Patent: Nov. 24, 2009

(54) CARD HOLDER ARRANGEMENT FOR CIRCUIT ASSEMBLY

(75) Inventor: Patrick Wallace, San Jose, CA (US)

(73) Assignee: Symbol Technologies, Inc., Holtsville, NY (US)

( * ) Notice: Subject to any disclaimer, the term of this patent is extended or adjusted under 35 U.S.C. 154(b) by 387 days.

(21) Appl. No.: 11/265,715

(22) Filed: Nov. 2, 2005

(65) Prior Publication Data

US 2007/0097663 A1    May 3, 2007

(51) Int. Cl.
    *H05K 7/12* (2006.01)
(52) U.S. Cl. .................. 361/801; 361/759; 361/747; 361/732; 361/726; 439/327; 439/326; 439/328
(58) Field of Classification Search .............. 361/679, 361/737, 748, 801, 802, 807, 814, 809, 810, 361/726, 732, 740, 747, 759; 439/326, 327, 439/328
    See application file for complete search history.

(56) References Cited

U.S. PATENT DOCUMENTS

| | | | | |
|---|---|---|---|---|
| 4,774,126 A * | 9/1988 | Dorsey et al. | ................ | 428/209 |
| 5,267,973 A * | 12/1993 | Haber et al. | ................ | 604/195 |
| 5,333,100 A * | 7/1994 | Anhalt et al. | ................ | 361/818 |
| 5,337,220 A * | 8/1994 | Granitz | ................ | 361/816 |
| 5,373,149 A * | 12/1994 | Rasmussen | ................ | 235/492 |
| 5,490,038 A * | 2/1996 | Scholder et al. | ................ | 361/759 |
| 6,075,706 A * | 6/2000 | Learmonth et al. | ................ | 361/737 |
| 6,104,620 A * | 8/2000 | Dudas et al. | ................ | 361/800 |
| 6,231,364 B1 * | 5/2001 | Liu | ................ | 439/326 |
| 6,234,821 B1 * | 5/2001 | Tan | ................ | 439/328 |
| 6,270,369 B1 * | 8/2001 | Kato et al. | ................ | 439/326 |
| 6,286,638 B1 * | 9/2001 | Rowan et al. | ................ | 188/181 A |
| 6,394,831 B1 * | 5/2002 | Bowers et al. | ................ | 439/327 |
| 6,517,369 B1 * | 2/2003 | Butterbaugh et al. | ................ | 439/327 |
| 6,589,259 B1 * | 7/2003 | Solingen | ................ | 606/170 |
| 6,731,517 B1 * | 5/2004 | Yu | ................ | 361/807 |
| 6,971,899 B1 * | 12/2005 | Liu | ................ | 439/326 |
| 7,014,492 B1 * | 3/2006 | Lim et al. | ................ | 439/367 |
| 7,049,172 B2 * | 5/2006 | Wang et al. | ................ | 438/106 |
| 7,077,678 B1 * | 7/2006 | Korsunsky et al. | ................ | 439/326 |
| 7,211,743 B1 * | 5/2007 | Dorsett | ................ | 174/545 |
| 7,354,290 B2 * | 4/2008 | Zhan et al. | ................ | 439/326 |

* cited by examiner

*Primary Examiner*—Dameon E Levi

(57) ABSTRACT

Described is an apparatus for releasably coupling an electrical component to a circuit board comprising a frame and at least one tab. The frame releasably couples to the electrical component and circumscribes at least a portion of a perimeter of the electrical component when coupled thereto. The at least one tab mates with a tab receiving slot in the circuit board to releasably couple the frame to the circuit board. When the electrical component is coupled to the frame, a portion of the electrical component opposite the circuit board is exposed.

18 Claims, 7 Drawing Sheets

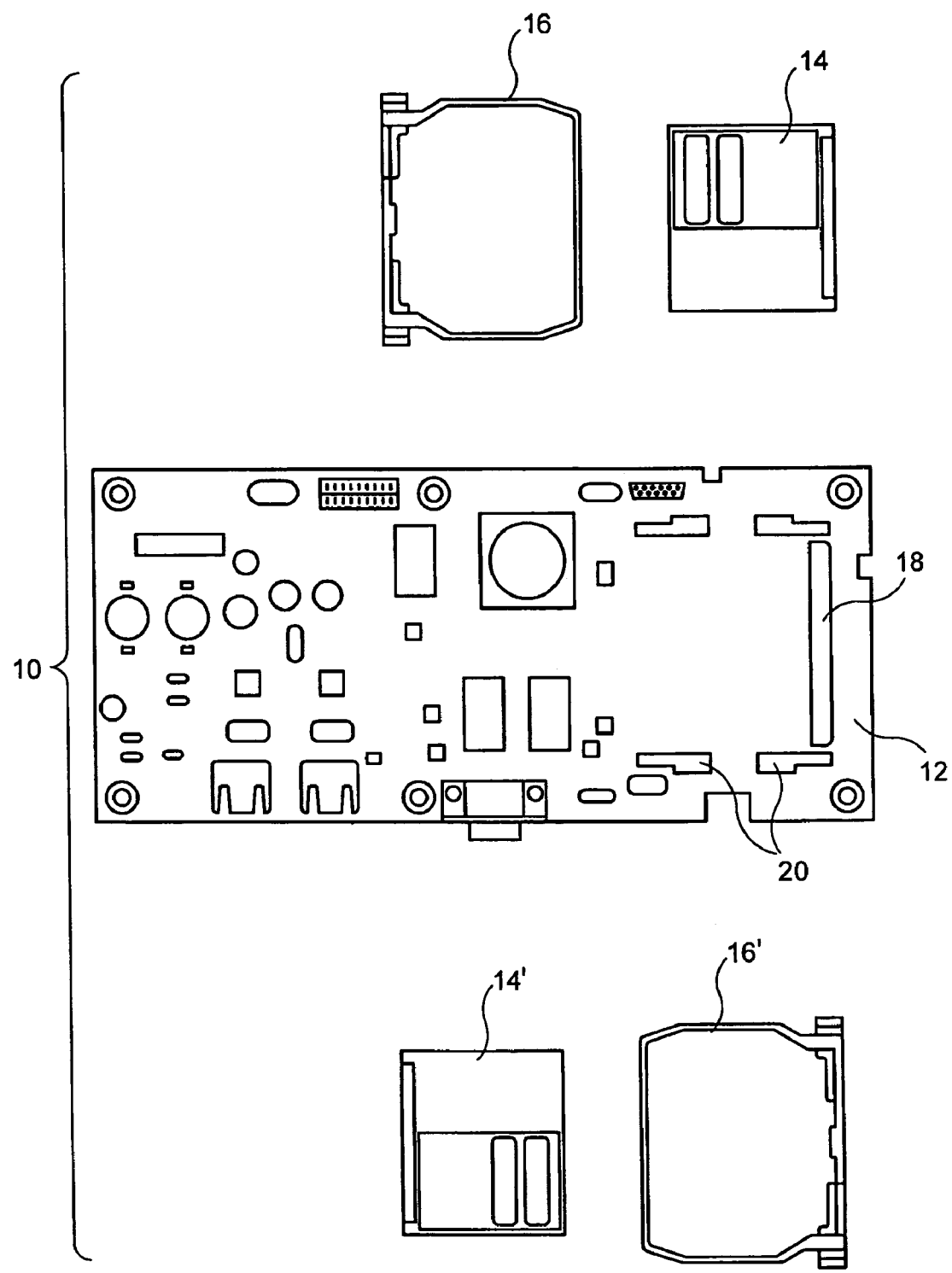
F I G. 1

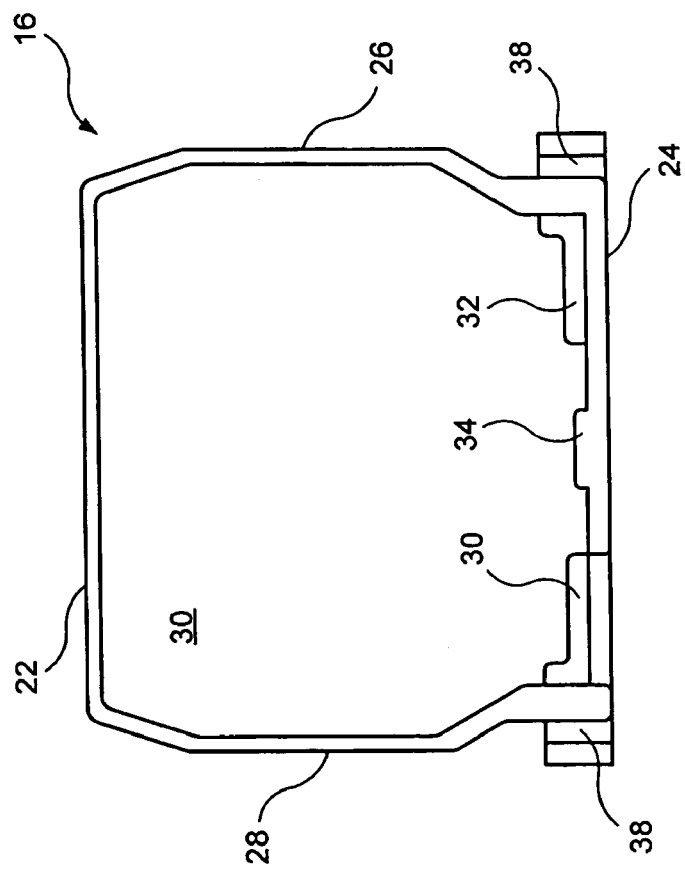
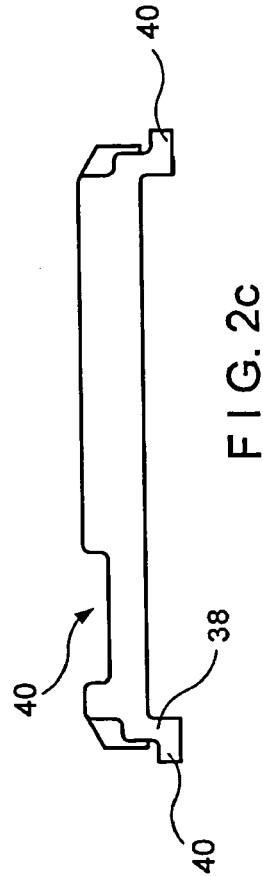
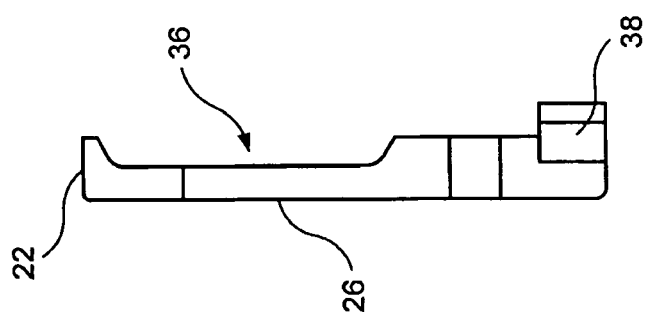
FIG. 2a
FIG. 2c
FIG. 2b

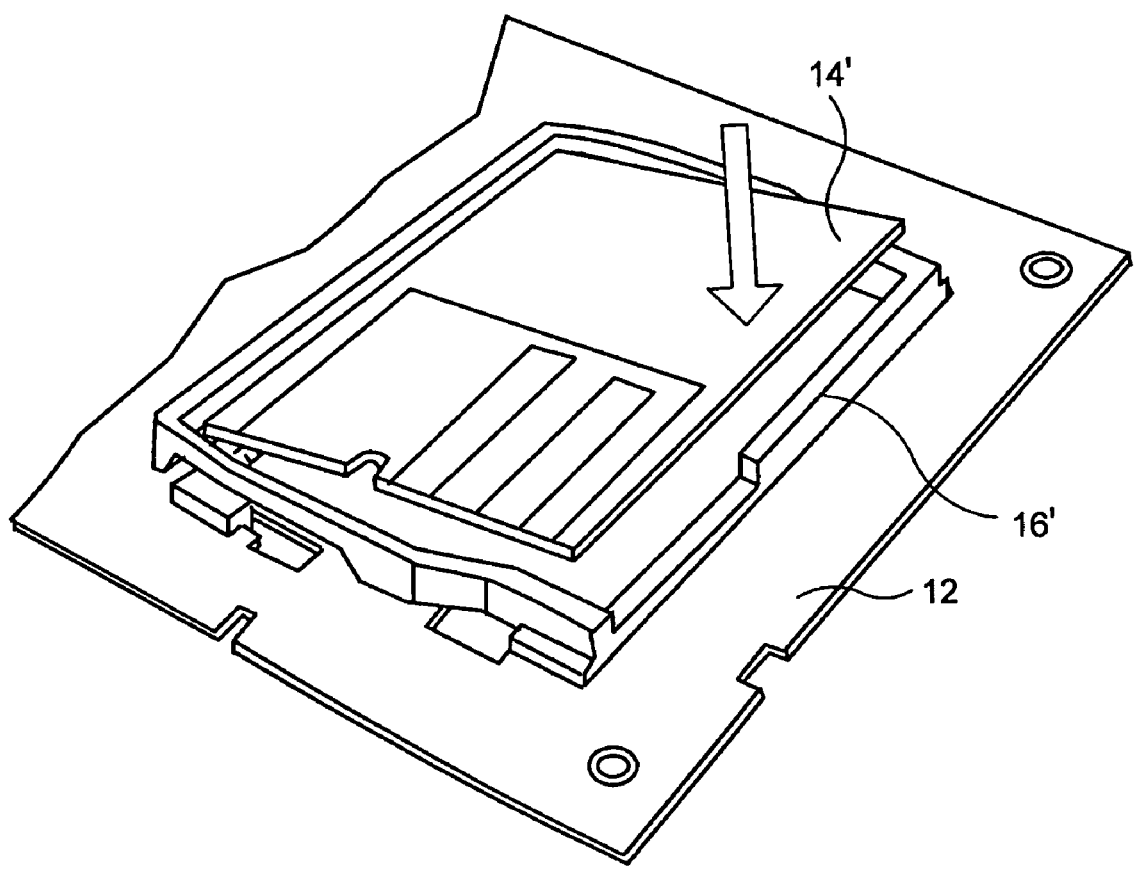
F I G. 11

CARD HOLDER ARRANGEMENT FOR CIRCUIT ASSEMBLY

BACKGROUND

Wireless devices, such as personal data assistants, may transmit and receive data via a wireless network (e.g., an 802.11x network) using removable Peripheral Component Interconnect ("PCI") radio cards or internal Mini PCI radio cards. Use of the Mini PCI radio card is favorable in smaller systems in which standard-sized PCI radio cards cannot be used due to spatial and/or mechanical constraints.

Today, a large percentage of the 802.11 radios are implemented in the Mini-PCI format because of its reduced size, high performance, modularity and lower cost. The Mini PCI format has been created to promote interchangeability of 802.11 radios between host systems, and to permit regulatory agencies to approve the radios independent of the host systems. The Mini PCI format includes several form factors including Types I, II and III, with Type III being the most common. The Type III Mini PCI radio card generally mates with a 124-pin card connector on a printed circuit board ("PCB") which is similar to the SO-DIMM type.

Although coupling the radio card to the card connector generally provides adequate electrical performance, small movements of the wireless device (e.g., a shock, vibration, shaking, etc.) may cause the radio card to lose/degrade its electrical connection with the card connector impairing functionality or disabling the wireless communications capability of the wireless device.

SUMMARY OF THE INVENTION

The present invention relates to an apparatus for releasably coupling an electrical component to a circuit board comprising a frame and at least one tab. The frame releasably couples to the electrical component and circumscribes at least a portion of a perimeter of the electrical component when coupled thereto. The at least one tab mates with a tab receiving slot in the circuit board to releasably couple the frame to the circuit board. When the electrical component is coupled to the frame, a portion of the electrical component opposite the circuit board is exposed.

BRIEF DESCRIPTION OF DRAWINGS

FIG. 1 shows an exemplary embodiment of a circuit assembly according to the present invention;

FIG. 2a shows a top view of an exemplary embodiment of a card mounting bracket according to the present invention;

FIG. 2b shows a side view of an exemplary embodiment of a card mounting bracket according to the present invention;

FIG. 2c shows a rear view of an exemplary embodiment of a card mounting bracket according to the present invention;

FIG. 11 shows a schematic view of a radio card, a card mounting bracket and a printed circuit board mounted to a reverse side thereof according to the present invention

DETAILED DESCRIPTION

Figure 3:
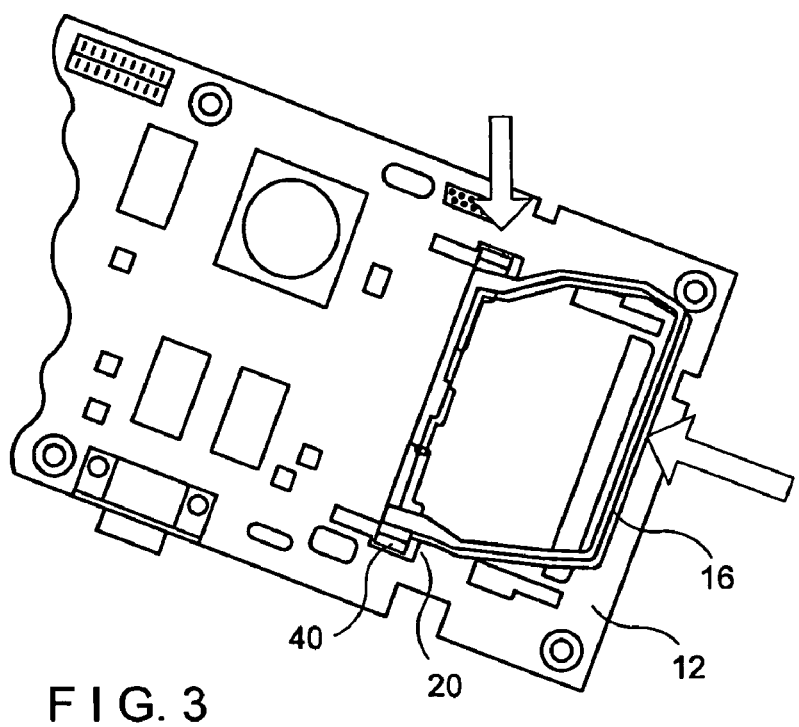
FIG. 3 shows a schematic view of a card mounting bracket and a printed circuit board according to the present invention.

The present invention may be further understood with reference to the following description and the appended drawings, wherein like elements are provided with the same reference numerals. The present invention describes a card holder arrangement for mounting an external component to a printed circuit board ("PCB"). Although, the exemplary embodiment will be described with reference to a PCB utilized in a wireless computing device, those of skill in the art will understand that the card holder arrangement of the present invention is scalable for use with larger/smaller external components (e.g., memory chips, standard PCI cards, etc.) and in larger/smaller computing devices (e.g., PCs, laptops, etc.).

FIG. 1 shows an exemplary embodiment of a circuit assembly 10 according to the present invention. The assembly 10 according to this embodiment is utilized in a wireless computing device such as, for example, an image/laser-based scanner, an RFID reader/tag, a laptop, a phone, a PDA, a tablet, a network interface card, etc. In alternative embodiments, the assembly 10 may be utilized in a stationary computing device such as a PC. That is, any computing device may utilize the assembly 10 for coupling an external component to a circuit board providing additional functionality to the computing device.

The assembly 10 includes a printed circuit board ("PCB") 12, an external component (e.g., a radio card 14) and a component mounting bracket 16. The PCB 12 may be any size, shape and/or design (e.g., form factor) known to those of skill in the art. As one of ordinary skill in the art will understand, the PCB 12 may include any number and variety of electrical components (e.g., processors, memory, etc.) coupled to either surface of the PCB 12 (e.g., top and/or bottom). In the exemplary embodiment, the PCB 12 includes a card connector 18 for sustaining an electrical connection with the radio card 14. The card connector 18 includes pins which, when in contact with pins of the radio card 14, allow for an exchange of electrical signals between the radio card 14 and electrical components on the PCB 12.

At least one pair of slots 20 are formed adjacent to the card connector 18 allowing the bracket 16 to be mounted to the PCB 12. In the exemplary embodiment, the PCB 12 includes two pairs of slots 20 which allow two component mounting brackets 16 to be mounted thereto. Thus, in the exemplary embodiment, two radio cards 14 may be mounted to substantially similar areas of the PCB 12, on opposite sides thereof. However, those of skill in the art will understand that the pairs of slots 20 may be formed in any suitable areas on the PCB 12 for mounting the brackets 16 and corresponding radio cards 14 thereto (e.g., on both sides of the PCB 12). Furthermore, a number of the pairs of slots 20 preferably correspond to a number of radio cards 14 to be mounted to the PCB 12.

An exemplary embodiment of the bracket 16 is shown in FIGS. 2a-2c. The bracket 16 is preferably a frame formed of a single piece of material (e.g., plastic, rubber, ceramic, sheet metal, etc.) which is mountable to the PCB 12 without requiring mechanical and/or chemical fasteners. As would be understood by those skill in the art, the bracket 16 may be manufactured using any conventional process (e.g., injection molding). Conventional radio card mounting brackets are generally mechanically fastened to the PCB 12. The bracket 16 according to the present invention allows for toolless assembly of the bracket 16 to the PCB 12 and of the radio card 14 to the bracket 16. In the exemplary embodiment, the bracket 16 is interlocked to the PCB 12 using the slots 20. After the bracket 16 is mounted to the PCB 12, the radio card 14 is coupled to the card connector 18 and secured within the bracket 16. The bracket 16 prevents the radio card 14 from coming loose from the card connector 18 thereby maintaining its electrical connection with the PCB 12.

The bracket 16 includes a front wall 22, a rear wall 24 and sidewalls 26, 28 enclosing a generally rectangular area 30 sized and shaped to complement the radio card 14. Those of skill in the art will understand that the arrangement 10 may be of any size and/shape complementary to the size/shape of a component to be retained therein. Similarly, a stack height of the bracket 16 is preferably similar to a stack height of the component secured thereby (e.g., the radio card 14). The bracket 16 prevents lateral and vertical displacement of the radio card 14, as will be described further below. In one exemplary embodiment, the sidewalls 26, 28 are designed with a bow shape allowing a tension-extension length therein. The tension-extension length permits the rear wall 24 to move away from the front wall 22 for accommodating slight variances in the length of the radio card 14 which may ensure a snug fit at assembly.

An inner face of the rear wall 24 includes ledges 30, 32 which preferably have a stack height similar to that of as the card connector 18. That is, when the radio card 14 is coupled to the card connector 18, there is preferably a space between the radio card 14 and the surface of the PCB 12. The radio card 14 rests on the ledges 30, 32 to be maintained at the stack height of the card connector 18 providing integrity to the electrical connection. Those of skill in the art will understand that other exemplary embodiments of the bracket 16 may include a single ledge or a plurality of ledges for maintaining the radio card 14 at the stack height of the card connector 18.

The inner face of the rear wall 22 further includes a retaining member 34 centered between the ledges 30, 32 at a predetermined height thereabove. The height is preferably equal to at least a thickness of the installed radio card 14. Thus, when the radio card 14 is depressed onto the ledges 30, 32, the radio card 14 is secured between the retaining member 34 and the ledges 30, 32. The retaining member 34 preferably includes a protruding downward slope providing resistance to the radio card 14 as it is pushed onto the ledges 30, 32. When the radio card 14 is pressed past the slope, the radio card 14 snap-fits between the slope and the ledges 30, 32. Thus, the retaining member 34 and the ledges 30, 32 prevent the radio card 14 from moving vertically when coupled to the card connector 18.

As shown in FIG. 2b, each of the sidewalls 26, 28 includes a notch 36 at a front end thereof and an interlocking tab 38 at a rear end thereof. The notch 36 provides space for a tab of a further bracket to be mounted on a substantially similar portion of the PCB 12, but on an opposite side thereof. The tab 38 includes a foot 40 which retains the tab 38 within the slot 20. That is, to lock the bracket 16 to the PCB 12, the foot 40 is inserted into a portion of the slot 20 which is narrower than a width of the foot 40. Thus, the bracket 16 cannot be removed from the PCB 12 until the foot 40 is removed from the slot 20.

Referring back to FIG. 2a, the radio card 14 is removed from the bracket 16 by applying a compressive force to the sidewalls 26, 28. That is, the sidewalls 26, 28 bow outward providing a predetermined clearance between themselves and the radio card 14. The compressive force distends the rear wall 24 releasing the radio card 14 from the retaining member 34. The radio card 14 may then be lifted from the bracket 16. A cut-out 40 is provided in the rear wall 24 to facilitate lifting the radio card 14 from the bracket 16.

FIGS. 3-8 show an exemplary method of mounting the bracket 16 to the PCB 12, coupling the radio card 14 to the card connector 18 and securing the radio card 14 in the bracket 16. In FIG. 3, the tabs 38 are inserted into the slots 20. As shown, a wide portion of the slot 20 receives the foot 40 while a narrow portion of the slot 20 retains the foot 40 securing the bracket to the PCB 12.

Figure 4:
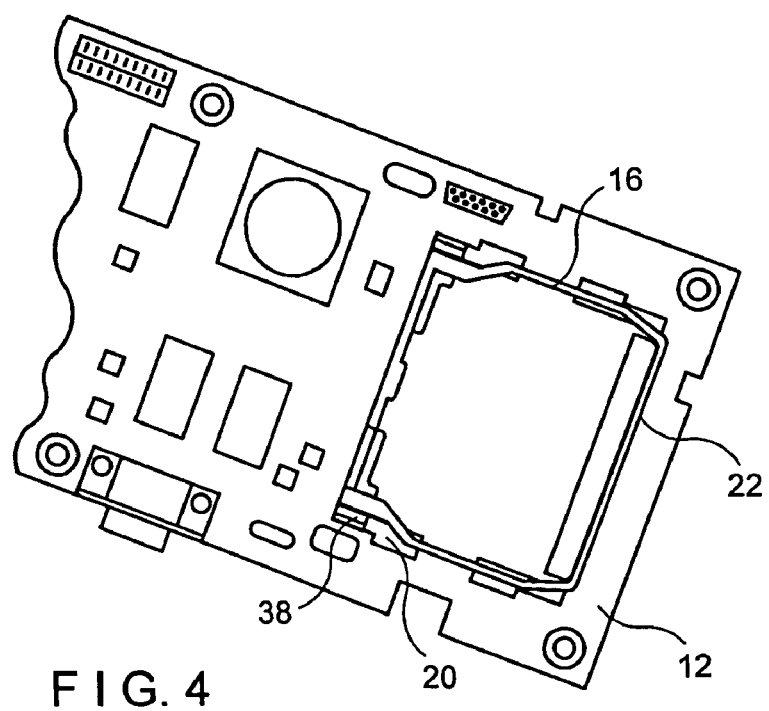
FIG. 4 shows a schematic view of a card mounting bracket and a printed circuit board according to the present invention.
Figure 5:
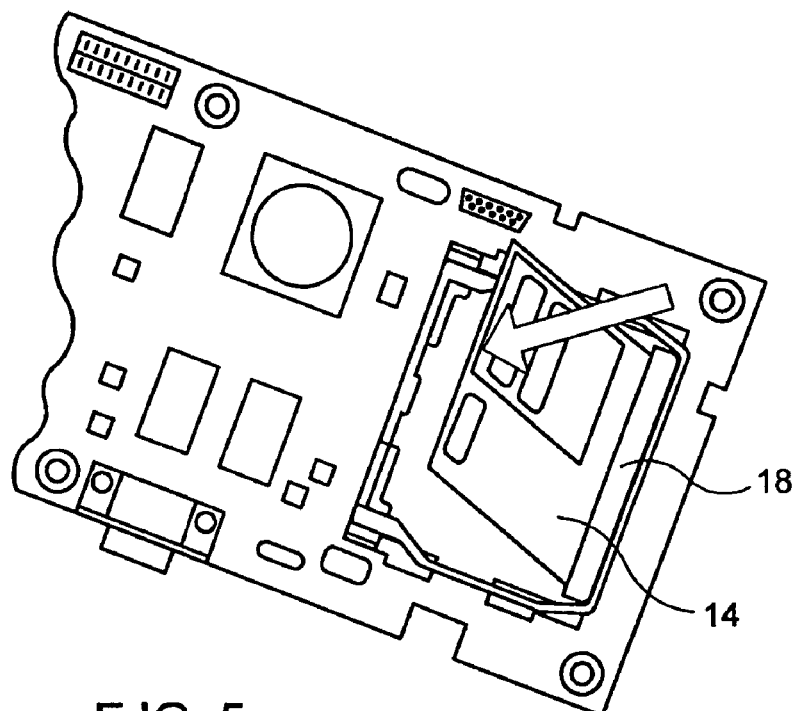
FIG. 5 shows a schematic view of a radio card, a card mounting bracket and a printed circuit board according to the present invention.

In FIG. 4, the bracket 16 is mounted to the PCB 12 with the tabs 38 interlocked with the slots 20 and the front wall 22 abutting the card connector 18. FIG. 5 shows the radio card 14 being coupled to the card connector 18 with the electrical contacts of the radio card 14 contacting corresponding contacts on the card connector 18.

Figure 6:
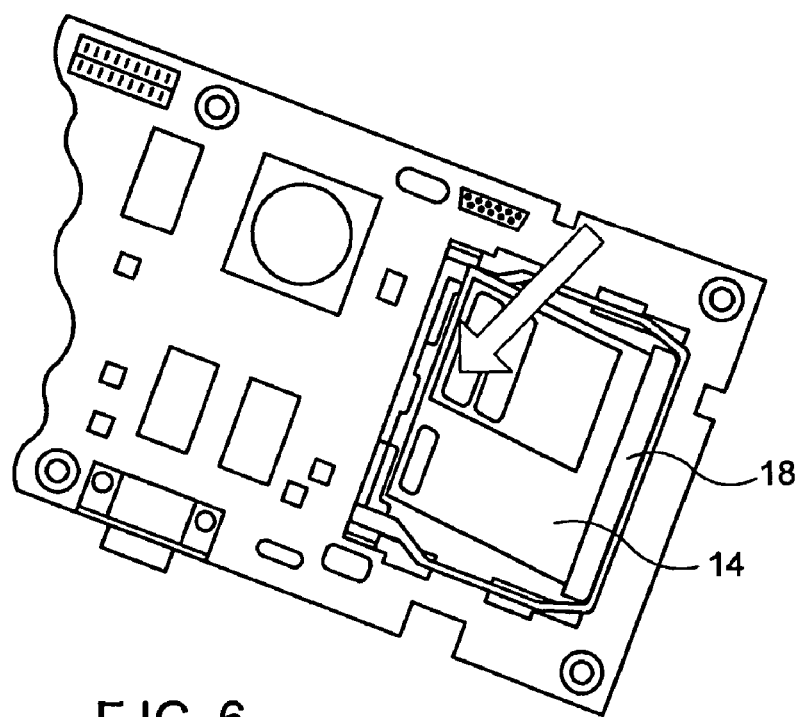
FIG. 6 shows a schematic view of a radio card, a card mounting bracket and a printed circuit board according to the present invention.
Figure 7:
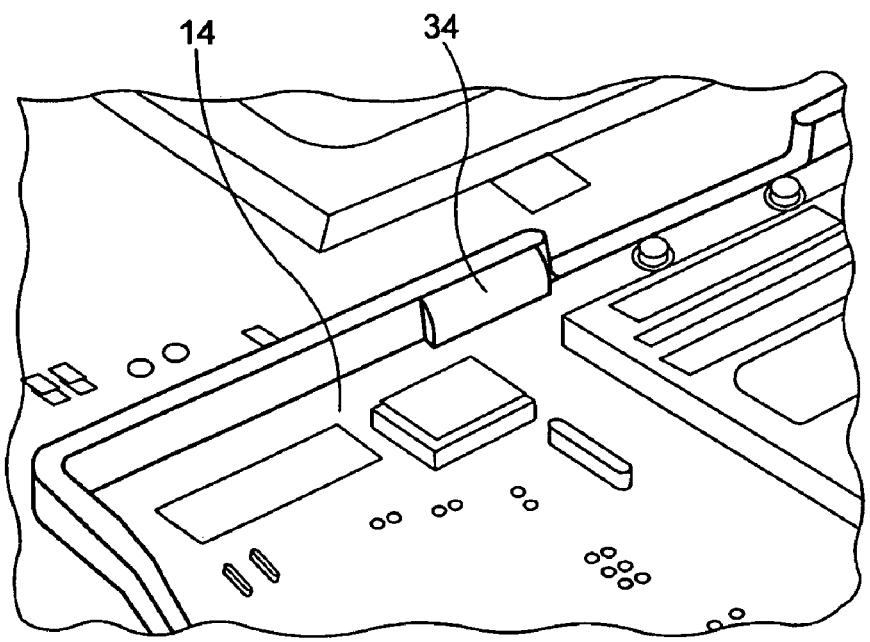
FIG. 7 shows a close-up view of a retaining member on a card mounting bracket and a radio card according to the present invention.

In FIG. 6, the radio card 14 is shown with the electrical contacts thereof fully engaged with the contacts of the PCB 12 and the card connector 18 with a first side of the radio card 14 contacting the bracket 16. At this point, the radio card 14 has not yet been inserted between the retaining member 34 and the ledges 30,32. FIG. 7 shows the radio card 14 after it has been pushed past the retaining member 34 to secure the radio card 14 within the bracket 16 and prevent vertical displacement of the radio card 14 during use, a shock event, etc.

Figure 8:
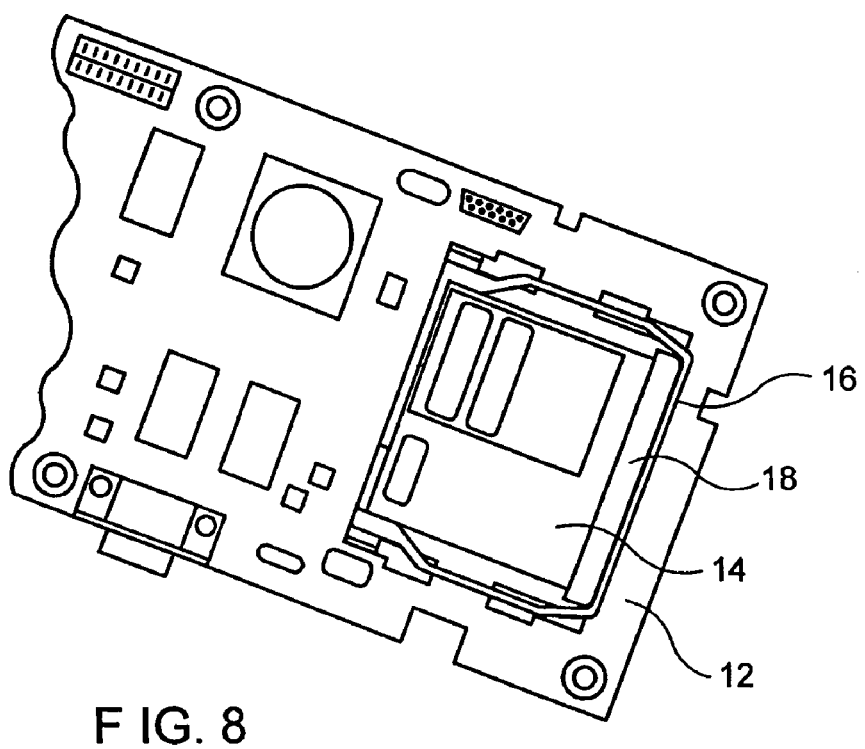
FIG. 8 shows a schematic view of a radio card and a card mounting bracket mounted to a printed circuit board according to the present invention.

FIG. 8 shows a complete mechanical and electrical assembly of the PCB 12, bracket 16 and radio card 14. The bracket 16 is preferably sized to fence-in the radio card 14 and the card connector 18. When the radio card 14 is coupled to the card connector 18 the bracket 16 is prevented from disengaging the slots 20, because the radio card 14 prevents movement of the rear wall 24. Thus, the tabs 38 cannot reach the portion of the slots 20 from which the foot 40 may exit.

FIG. 8 also shows that when installed, electrical components on the radio card 14 are exposed. This configuration allows external heat-sinking of hot areas the radio card 14 improving performance and life. For example, a conventional heat sink may be placed adjacent the exposed area of the radio card 14. In another embodiment, the bracket 16 may be fitted with a cover (not shown) over the area 30 which would aid in electromagnetic shielding and electrostatic discharge protection.

Figure 9:
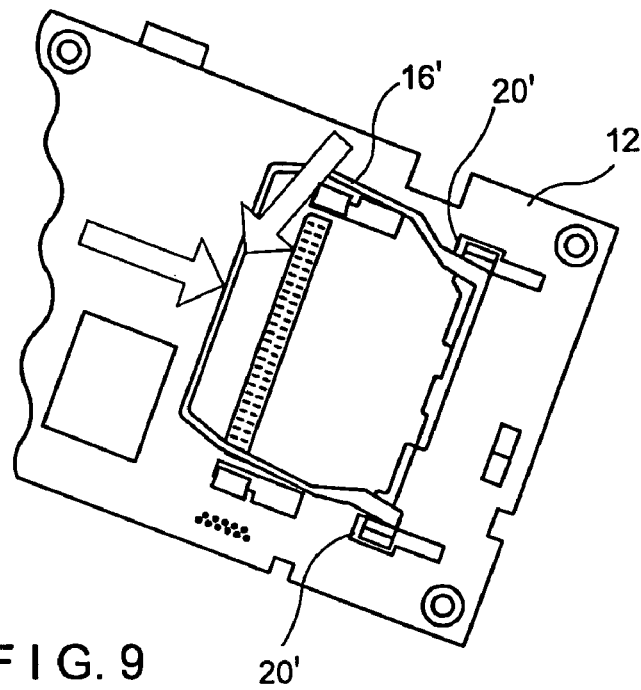
FIG. 9 shows a schematic view of a card mounting bracket and a printed circuit board mounted to a reverse side thereof according to the present invention.
Figure 10:
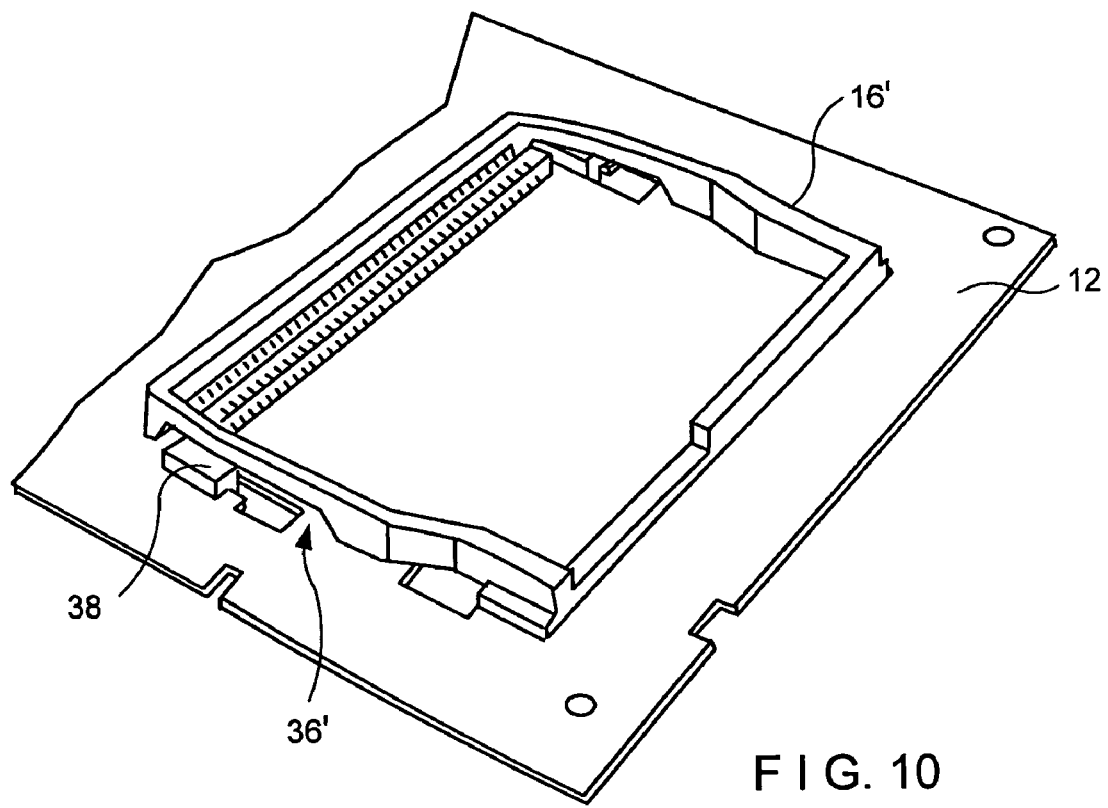
FIG. 10 shows a schematic view of a card mounting bracket and a printed circuit board mounted to a reverse side thereof according to the present invention.

As described above, a further radio card 14' may be mounted on an opposite side of the PCB 12 as shown in FIGS. 9-11. A bracket 16' is interlocked with slots 20' in a manner substantially similar to that described above in regard to the bracket 16 and the slots 20. As shown in FIG. 10, a notch 36' in the bracket 16' provides clearance for the tab 38 of the bracket 16 mounted on the opposite side of the PCB 12. This allows the radio card 14 and the further radio card 14' to be mounted in similar positions on opposite sides of the PCB 12. Thus, multiple radio cards may be stacked on the PCB 12. The further radio card 14' is mounted to and removed from the bracket 16' in the manner described above.

The disclosed exemplary embodiments of the present invention may withstand approximately 0.02 g$^2$/Hz of random vibration in all three axises, approximately 20 Hz to 2000 Hz. The exemplary embodiments may also withstand at least a ninety-one (91) centimeter drop to a hard surface (e.g., concrete).

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. An apparatus for releasably coupling an electrical component to a circuit board, comprising:
   a frame releasably coupling to the electrical component and circumscribing at least a portion of a perimeter of the electrical component when coupled thereto;
   at least one tab mating with a tab receiving slot in the circuit board to releasably couple the frame to the circuit board,
   wherein, when the electrical component is electrically coupled to the circuit board, a portion of the electrical component opposite the circuit board is exposed, wherein the frame includes at least one compression member which, when a compressive force is applied thereto, causes a retaining member to release the electrical component, wherein the at least one tab includes an extended width locking portion which prevents the tab from being removed from a narrow width portion of the slot.

2. The apparatus of claim 1, wherein the frame includes at least one ledge supporting the electrical component at a first stack height above the circuit board.

3. The apparatus of claim 2, wherein the frame includes a retaining member securing the electrical component to the at least one ledge.

4. The apparatus of claim 2, wherein the first stack height is equal to a second stack height of a further electrical component attached to the circuit board and mating with the electrical component.

5. The apparatus of claim 1, wherein the component is a radio card.

6. The apparatus of claim 1, wherein the apparatus is made from one of plastic, rubber, ceramic, sheet metal and cast metal.

7. The apparatus of claim 1, wherein the frame includes a notch receiving a further tab of a further bracket mounted to an opposite side of the circuit board.

8. The apparatus of claim 1, wherein the exposed portion of the electrical component allows external heat-sinking of the electrical component.

9. An arrangement, comprising:
   a circuit board having at least one tab receiving slot formed therein;
   an electrical component; and
   a component mounting bracket including a frame releasably coupling to the electrical component and circumscribing at least a portion of a perimeter of the electrical component when coupled thereto, the bracket including at least one tab mating with a tab receiving slot in the circuit board to releasably couple the frame to the circuit board,
   wherein, when the electrical component is electrically coupled to the circuit board frame, a portion of the electrical component opposite the circuit board is exposed, wherein the frame includes at least one compression member which, when a compressive force is applied thereto, causes a retaining member to release the electrical component, wherein the at least one tab includes an extended width locking portion which prevents the tab from being removed from a narrow width portion of the slot.

10. The arrangement of claim 9, wherein the frame includes at least one ledge supporting the electrical component at a first stack height above the circuit board.

11. The arrangement of claim 10, wherein the frame includes a retaining member securing the electrical component to the at least one ledge.

12. The arrangement of claim 10, wherein the first stack height is equal to a second stack height of a further electrical component attached to the circuit board and mating with the electrical component.

13. The arrangement of claim 9, wherein the component is a radio card.

14. The arrangement of claim 9, wherein the bracket is made from one of plastic, rubber, ceramic, sheet metal and cast metal.

15. A portable electronic device, comprising:
   a circuit board having at least one tab receiving slot formed therein;
   an electrical component; and
   a component mounting bracket including a frame releasably coupling to the electrical component and circumscribing at least a portion of a perimeter of the electrical component when coupled thereto, the bracket including at least one tab mating with a tab receiving slot in the circuit board to releasably couple the frame to the circuit board, wherein, when the electrical component is electrically coupled to the circuit board, a portion of the electrical component opposite the circuit board is exposed, wherein the frame includes at least one compression member which, when a compressive force is applied thereto, causes a retaining member to release the electrical component, wherein the at least one tab includes an extended width locking portion which prevents the tab from being removed from a narrow width portion of the slot.

16. The device of claim 15, wherein the device includes one of a cell phone, a laptop, a PC, a network interface card, a PDA, a tablet, an image-based scanner, a laser-based scanner and an RFID reader.

17. The device of claim 15, wherein the component is a Mini PCI card.

18. A method for assembling a circuit arrangement, comprising:
   providing a circuit board having at least one tab receiving slot formed therein;
   mounting a component mounting bracket to the circuit board, the bracket including a frame releasably coupling to an electrical component and circumscribing at least a portion of a perimeter of the electrical component when coupled thereto, the bracket including at least one tab mating with the at least one tab receiving slot in the circuit board to releasably couple the frame to the circuit board; and coupling the electrical component to the bracket so that when the electrical component is electrically coupled to the circuit board, a portion of the electrical component opposite the circuit board is exposed, wherein the frame includes at least one compression member which, when a compressive force is applied thereto, causes a retaining member to release the electrical component, wherein the at least one tab includes an extended width locking portion which prevents the tab from being removed from a narrow width portion of the slot.

* * * * *

UNITED STATES PATENT AND TRADEMARK OFFICE
CERTIFICATE OF CORRECTION

PATENT NO. : 7,623,357 B2  Page 1 of 1
APPLICATION NO. : 11/265715
DATED : November 24, 2009
INVENTOR(S) : Wallace It is certified that error appears in the above-identified patent and that said Letters Patent is hereby corrected as shown below:

Column 2, Line 12, delete "invention" and insert -- invention. --, therefor.

Column 6, Line 15, in Claim 14, delete "The" and insert -- An --, therefor.

Signed and Sealed this

Sixteenth Day of February, 2010

David J. Kappos
*Director of the United States Patent and Trademark Office*